US010770360B2

(12) United States Patent
Zhou

(10) Patent No.: US 10,770,360 B2
(45) Date of Patent: Sep. 8, 2020

(54) SEMICONDUCTOR STRUCTURES AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 0 days.

(21) Appl. No.: 15/496,026

(22) Filed: Apr. 25, 2017

(65) Prior Publication Data

US 2018/0012810 A1    Jan. 11, 2018

(30) Foreign Application Priority Data

Jul. 7, 2016  (CN) .......................... 2016 1 0531672

(51) Int. Cl.
*H01L 21/8238*     (2006.01)
*H01L 21/28*       (2006.01)
(Continued)

(52) U.S. Cl.
CPC ............... *H01L 21/823842* (2013.01); *H01L 21/28088* (2013.01); *H01L 21/823821* (2013.01);
(Continued)

(58) Field of Classification Search
None
See application file for complete search history.

(56) References Cited

U.S. PATENT DOCUMENTS 9,384,962 B2 * 7/2016 Hwang ........... H01L 21/823842
9,490,334 B2 * 11/2016 Lu ..................... H01L 29/42376
(Continued)

FOREIGN PATENT DOCUMENTS

CN        102956556 A      3/2013
CN        103165429 A      6/2013
(Continued)

OTHER PUBLICATIONS

The European Patent Office (EPO) The Extended European Search Report for 17179927.3 dated Nov. 8, 2017 12 Pages.

*Primary Examiner* — Abul Kalam
(74) *Attorney, Agent, or Firm* — Anova Law Group, PLLC

(57) ABSTRACT

A method for fabricating a semiconductor structure includes providing a base structure including a substrate, a dielectric layer formed on the substrate, a plurality of first openings formed in the dielectric layer in a first transistor region, and a plurality of second openings formed in the dielectric layer in a second transistor region. The method also includes forming a first work function layer an the dielectric layer covering bottom and sidewall surfaces of the first and the second openings, forming a first sacrificial layer in each first opening and each second opening with a top surface lower than the top surface of the dielectric layer, removing a portion of the first work function layer exposed by the first sacrificial layer, removing the first work function layer formed in each first opening, and forming a second work function layer and a gate electrode in each first opening and each second opening.

12 Claims, 11 Drawing Sheets

(51) Int. Cl.
*H01L 27/092* (2006.01)
*H01L 29/08* (2006.01)
*H01L 29/49* (2006.01)
*H01L 29/66* (2006.01)

(52) U.S. Cl.
CPC ...... *H01L 27/0924* (2013.01); *H01L 29/0847* (2013.01); *H01L 29/4966* (2013.01); *H01L 29/66545* (2013.01)

(56) References Cited

U.S. PATENT DOCUMENTS

| | | | |
|---|---|---|---|
| 9,685,531 B2* | 6/2017 | Lu | H01L 29/42376 |
| 2010/0068877 A1* | 3/2010 | Yeh | H01L 21/823842 |
| | | | 438/592 |
| 2011/0248359 A1 | 10/2011 | Hwang et al. | |
| 2012/0256276 A1* | 10/2012 | Hwang | H01L 21/823842 |
| | | | 257/410 |
| 2013/0075827 A1* | 3/2013 | Lee | H01L 29/4966 |
| | | | 257/369 |
| 2013/0154021 A1 | 6/2013 | Chuang et al. | |
| 2014/0306273 A1* | 10/2014 | Ho | H01L 21/28088 |
| | | | 257/288 |
| 2015/0263132 A1 | 9/2015 | Liu et al. | |
| 2016/0071944 A1 | 3/2016 | Lu et al. | |
| 2016/0104621 A1 | 4/2016 | Zang | |
| 2017/0243869 A1* | 8/2017 | Chang | H01L 21/823821 |

FOREIGN PATENT DOCUMENTS

| | | |
|---|---|---|
| CN | 104217954 A | 12/2014 |
| CN | 105470200 A | 4/2016 |

\* cited by examiner

SEMICONDUCTOR STRUCTURES AND FABRICATION METHODS THEREOF

CROSS-REFERENCES TO RELATED APPLICATIONS

This application claims the priority of Chinese Patent Application No. CN201610531672.4, filed on Jul. 7, 2016, the entire content of which is incorporated herein by reference.

FIELD OF THE DISCLOSURE

The present disclosure generally relates to the field of semiconductor fabrication technology and, more particularly, relates to semiconductor structures and fabrication methods thereof.

BACKGROUND

With continuous development of semiconductor technology, the feature size of semiconductor device s gradually decreases. The reduction of key dimensions means that more transistors can be arranged on a single chip. In the meantime, the decrease in the feature size also provides challenges in the semiconductor fabrication process.

On a semiconductor chip, different transistors often have different threshold voltages. In order to tune the threshold voltage of a transistor, the semiconductor fabrication technology introduces a work function layer between the gate dielectric layer and the gate electrode when forming the transistor. Depending on the properties and characteristics of the introduced work function layer, such as the material, the thickness, etc. the work function layer may be able to adjust the work function of the transistor, and thus adjust the threshold voltage of the transistor. As such, the formation process for the transistor may be more complicated.

In current technology, using a high-k dielectric layer to form the gate dielectric layer and using a metal gate to form the gate electrode, i.e. using the high-k metal gate (HKMG) technique, has become a core technique to reduce the dimensions of semiconductor devices. Specifically, HKMG fabricated by a gate-last process demonstrates a number of advantages, such as lower energy consumption, smaller leakage current, stable high-frequency performance, etc., and thus has gradually become the semiconductor industry's favor.

However, because of the complexity of the gate-last process and the different requirements on the threshold voltages of different devices formed on the same chip, the fabrication methods for existing semiconductor structures are very complicated. The disclosed semiconductor structures and fabrication methods thereof are directed to solve one or more problems set forth above and other problems in the art.

BRIEF SUMMARY OF THE DISCLOSURE

One aspect of the present disclosure includes a method for fabricating a semiconductor structure. The method for fabricating the semiconductor structure includes providing a base structure including a first transistor region and a second transistor region. The base structure includes a substrate, a dielectric layer formed on the substrate, a plurality of first openings formed in the dielectric layer in the first transistor region, and a plurality of second openings formed in the dielectric layer in the second transistor region. The method also includes forming a first work function layer on the dielectric layer and covering bottom and sidewall surfaces of each of the first opening and the second opening, and forming a first sacrificial layer in each first opening and each second opening. The top surface of the first sacrificial layer is lower than a top surface of the dielectric layer. Further, the method includes removing a portion of the first work function layer exposed by the first sacrificial layer using the first sacrificial layer as an etch mask, removing the first work function layer formed in each first opening, and forming a second work function layer and a gate electrode in each first opening and each second opening.

Another aspect of the present disclosure provides another method for fabricating a semiconductor structure. The method includes providing a base structure including a first transistor region and a second transistor region. The base structure includes a substrate, a dielectric layer formed on the substrate, a plurality of first openings formed in the dielectric layer in the first transistor region, and a plurality of second openings formed in the dielectric layer in the second transistor region. The method also includes forming a first work function layer on the dielectric layer and covering bottom and sidewall surfaces of each of the first opening and the second opening, removing a portion of the first work function layer formed in the first transistor region, and forming a first sacrificial layer in each first opening and each second opening. The top surface of the first sacrificial layer is lower than a top surface of the dielectric layer. Further, the method includes removing a portion of the first work function layer exposed by the first sacrificial layer in the second transistor region using the first sacrificial layer as an etch mask, removing the first sacrificial layer, and forming a second work function layer and then a gate electrode in each first opening and each second opening.

Another aspect of the present disclosure provides a semiconductor structure. The semiconductor structure includes a base structure including a first transistor region and a second transistor region. The base structure further includes a substrate, a dielectric layer formed on the substrate, and a plurality of fin structures including first fin structures formed in the first transistor regions are and second fin structures formed in the second transistor region. The semiconductor structure also includes a plurality of first gate structures, formed on the first fin structures in the first transistor region and a plurality of second gate structures, formed on fin structures in the second transistor region. Moreover, each first gate structure includes a gate dielectric layer formed on the corresponding fin structure, a second work function layer formed on the gate dielectric layer and covering sidewall surfaces of the dielectric layer, and a first gate electrode formed on the second work function layer; each second gate structure includes a gate dielectric layer formed on the corresponding fin structure, a first work function layer formed on the gate dielectric layer and covering a bottom portion of the sidewall surfaces, a second work function layer formed on the first work function layer and covering a top portion of the sidewall surfaces of the dielectric layer, and a second gate electrode formed on the second work function layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Whenever possible, the same reference numbers will be used throughout the drawings to refer to the same or like parts.

The existing fabrication methods for semiconductor structures are complicated. In the following, an existing fabrication method for a semiconductor structure will be provided to illustrate the reasons that lead to the complicated fabrication method for the semiconductor structure. FIGS. 1-4 show schematic cross-section views of the existing fabrication method for the semiconductor structure.

Figure 1:
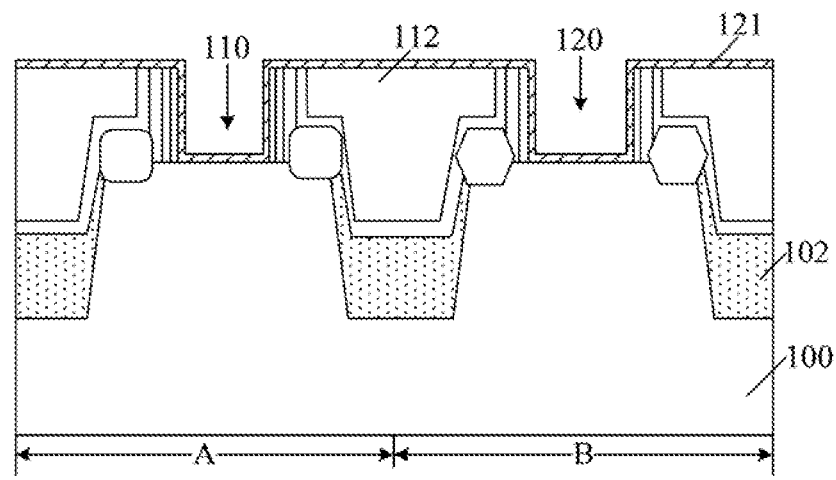
FIGS. 1-4 illustrate schematic cross-section views of semiconductor structures at certain stages of an existing fabrication process.

Referring to FIG. 1, the fabrication method includes providing a base structure. The base structure is divided into a first region A and a second region B. The base structure includes a substrate 100, a dielectric layer 112 formed on the substrate 100, a first opening 110 formed in the dielectric layer 112 of the first region A, and a second opening 120 formed in the dielectric layer 112 of the second region B.

Further, a first work function layer 121 is formed above the first opening 110, the second opening 120, and the dielectric layer 112.

Figure 2:
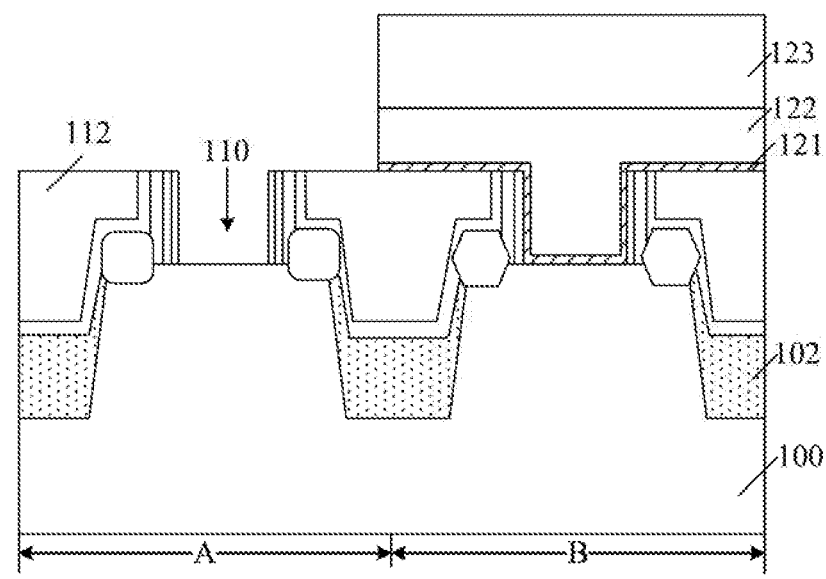

Referring to FIG. 2, further, the portion of the first work function layer 121 formed on the base structure in the first region A is then removed. Specifically, the process to remove the first work function layer formed on the base structure in the first region A includes the following steps. First, a first initial anti-reflection coating layer (not shown) is formed in both the first region A and the second region B. Then, a patterned first photoresist layer 123 is formed to cover the portion of the first initial anti-reflection coating layer in the second region B. Further, a first anti-reflection coating layer 122 is formed by patterning the first initial anti-reflection coating layer using the first photoresist layer 123 as a mask. Moreover, the portion of the first work function layer 121 formed in the first region A is removed by etching the first work function layer 121 using the first anti-reflection coating layer 122 and the first photoresist layer 123 as an etch mask. Finally, the first photoresist layer 123 and the first anti-reflection coating layer 122 are removed.

Figure 3:
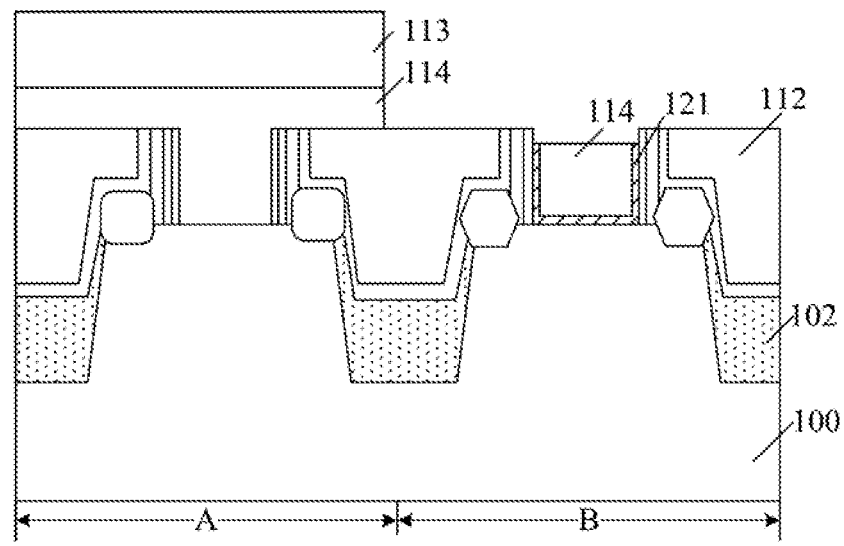
Figure 4:
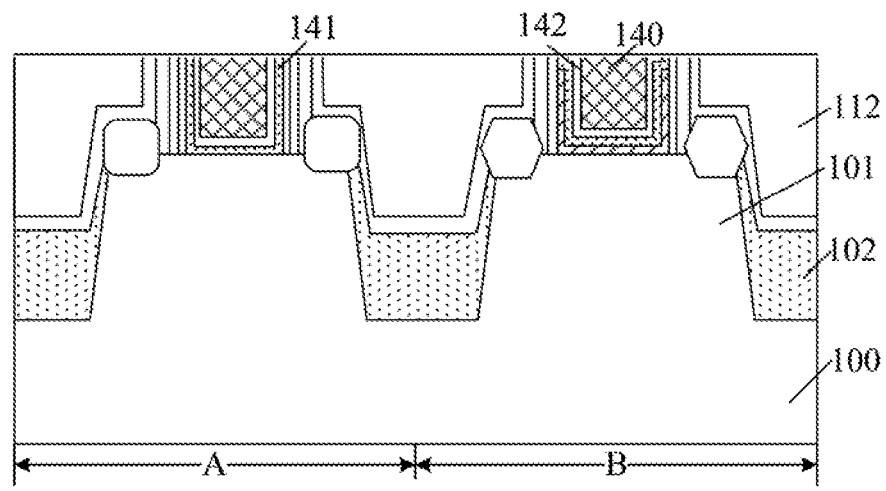

Further, referring to FIG. 3, the portion of the first work function layer 121 formed on the dielectric layer 112 in the second region B together with a portion of the first work function layer 121 formed on the sidewall surfaces of the second opening 120 (referring to FIG. 1) are removed. Specifically, removing the portion of the first work function layer 121 formed on the dielectric layer 112 in the second region B and a portion of the sidewall surfaces of the second opening 120 further includes the following steps. First, a second initial anti-reflection coating layer (not shown) is formed on the base structure. A patterned second photoresist layer 113 is then formed on the second initial anti-reflection coating layer to cover the portion of the second initial anti-reflection coating layer formed in the first region A. Moreover, a second anti-reflection layer 114 is formed by removing the second initial anti-reflection layer formed on the dielectric layer 112 and a portion of the second initial anti-reflection layer formed in the second opening 120. Further, the first work function layer 121 formed on the dielectric layer 112 as well as a portion of the first work function layer limited in the second opening 120 are removed by etching the first work function layer 121 formed on the base structure of the second region B using the second anti-reflection layer 114 and the second photoresist layer 113 as an etch mask. Finally, the second photoresist layer 113 and the second anti-reflection coating layer 114 are removed to form a third opening in the dielectric layer 112 in the second region B.

Further, referring to 4, a second work function layer 141, a covering layer 142, and a metal gate 140 are consecutively formed in the first opening 110 (referring to FIG. 3) and the second opening 120 (referring to FIG. 3).

Specifically, because the type of the transistors formed in the first region A may be different from the type of the transistors formed in the second region B, the total work function of all layers formed between the metal gate electrode 114 and the substrate 100 in the first region A may also be different from the total work function of all layers formed between the metal gate electrode 114 and the substrate 100 in the first region B. Therefore, an etching process using the first anti-reflection coating layer 121 and the first photoresist layer 123 as an etch mask needs to be performed to remove the portion of the first work function layer 121 formed in the first region A.

Because the feature sizes of the semiconductor structure are reduced, the dimensions of the first opening 110 (referring to FIG. 1) and the second opening 120 (referring to FIG. 1) formed after removing the dummy gate electrode (not shown) may also be small. In order to ensure the subsequently-formed second work function layer 141 and the subsequently-formed metal gate electrode 140 be able to fill the second opening 120, a top portion of the first work function layer 121 formed in the second opening 120 may need to be removed using the second photoresist layer 113 and the second anti-reflection coating layer 114 as an etch mask, and thus a third opening with a larger top dimension may be formed.

Therefore, the fabrication method described above includes forming two photoresist layers and two anti-reflection coating layers. Further, the fabrication method also includes performing a patterning process on each of the two anti-reflection coating layers. That is, the fabrication method requires two patterning processes. Therefore, the fabrication method described above is very complicated.

Figure 20:
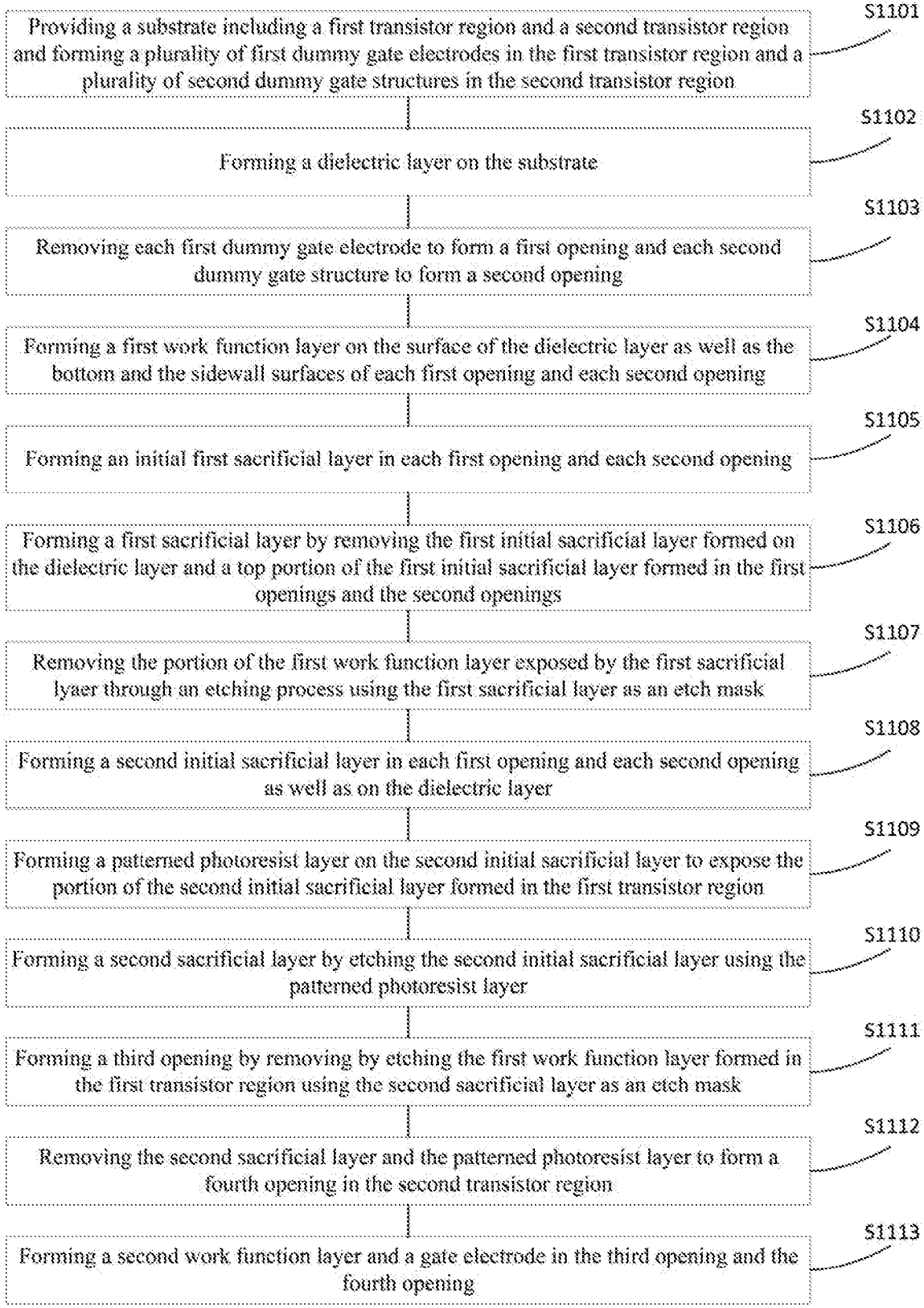
FIG. 20 illustrates a flowchart of an exemplary fabrication process for a semiconductor structure consistent with various disclosed embodiments in the present disclosure.

The present disclosure provides a method for fabricating a semiconductor structure. FIG. 20 shows a flowchart of an exemplary fabrication process for a semiconductor structure consistent with disclosed embodiments in the present disclosure. FIGS. 5-16 show schematic cross-section views of semiconductor structures at certain stages of the exemplary fabrication process.

Figure 5:
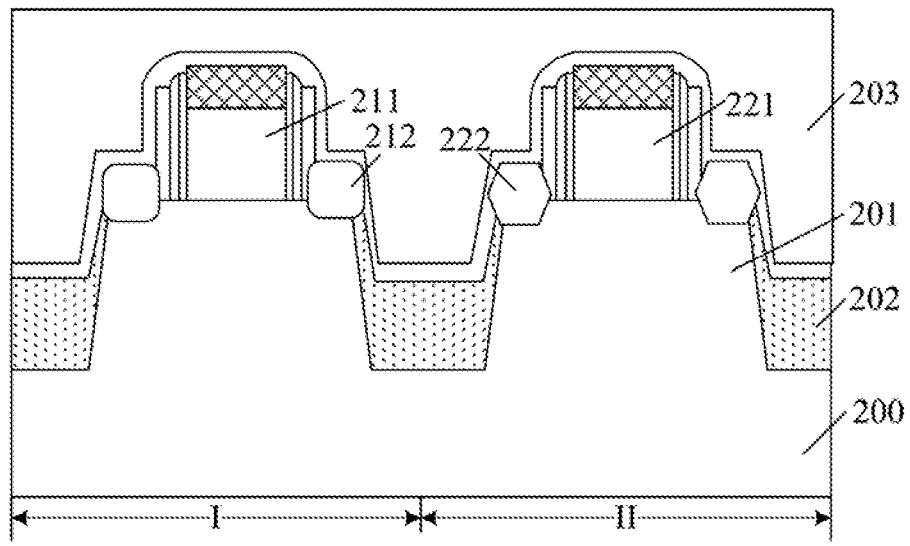
FIGS. 5-16 illustrate schematic cross-section views of semiconductor structures at certain stages of a fabrication process consistent with various disclosed embodiments in the present disclosure.

Referring to FIG. 20, at beginning of the fabrication process, an initial base structure is provided (S1101). FIG. 5 shows a schematic cross-section view of an initial base structure consistent with disclosed embodiments.

Referring to FIG. 5, an initial base structure is provided. The initial base structure may include a substrate and a plurality of dummy gate electrodes formed on the substrate. For illustration purpose, only two dummy gate electrodes formed on the substrate are shown in FIG. 5, although the disclosed semiconductor structure may include any number of dummy gate electrodes according to various embodiments of the present disclosure. The dummy gate electrodes may be used as sacrificial gate electrodes to pre-occupy spaces for subsequently formed gate electrodes.

In one embodiment, the initial base structure may include a first transistor region I and a second transistor region II. The dummy gate electrodes formed on the substrate in the first transistor region I are first dummy gate electrodes 211 and the dummy gate electrodes formed on the substrate in the second transistor region II are second dummy gate electrodes 221. For illustration purpose, the semiconductor structure shown in FIG. 5 is described to have one dummy gate electrode in the first transistor region I and one dummy gate electrode in the second transistor region II. In other embodiments, the number of the first dummy gate electrodes formed in the first transistor region I and the number of the second dummy gate electrodes formed in the second transistor region II may be more than one.

In one embodiment, transistors formed in the first transistor region I and the second transistor region II may be different. For example, the first transistor region I may be used to form N-type metal-oxide-semiconductor (NMOS) transistors while the second transistor region II may be used to form P-type metal-oxide-semiconductor (PMOS) transistors. In other embodiments, the first transistor region I may be used to form PNMOS transistors while the second transistor region II may be used to form NMOS transistors.

In one embodiment, the substrate may further include a bottom substrate 200 and a plurality of fin structures 201 formed on the bottom substrate 200. In another embodiment, the substrate may also be a planar substrate.

Moreover, in some embodiments, the bottom substrate 200 and the fin structures 201 may be made of silicon. In other embodiments, the bottom substrate and the fin structures may also be made of germanium, SiGe, or any other appropriate semiconductor material(s).

Further, in one embodiment, the first dummy gate electrode 211 and the second dummy gate electrode 221 may be made of polycrystalline silicon.

In one embodiment, the initial base structure may also include a plurality of first source/drain doped regions 212 formed in the fin structures 201 on both sides of each first dummy gate electrode 211, and a plurality of second source/drain doped regions 222 formed in the fin structures 201 on both sides of each second dummy gate electrode 221.

In one embodiment, the first transistor region I may be used to form NMOS transistors. The plurality of first source/drain doped regions 212 may be made of SiC and may be doped with first doping ions. The first doping ions may be phosphor ions or arsenic ions.

In one embodiment, the second transistor region II may be used to form PMOS transistors. The plurality of second source/drain doped regions 222 may be made of SiGe and may be doped with second doping ions. The second doping ions may be boron ions or boron fluoride ions.

Further, returning to FIG. 20, a dielectric layer may be formed on the initial base structure (S1102). Referring to FIG. 5, a dielectric layer 203 may be formed on the initial base structure. In one embodiment, the dielectric layer 203 may be made of $SiO_x$ or SiON.

Moreover, the top surface of the dielectric layer 203 may be leveled with the top surfaces of the dummy gate electrodes. Therefore, a planarization process may be performed after deposition of the material of the dielectric layer 203 to ensure the top surface of the formed dielectric layer 201 leveled with the top surfaces of the dummy gate electrodes.

Figure 6:
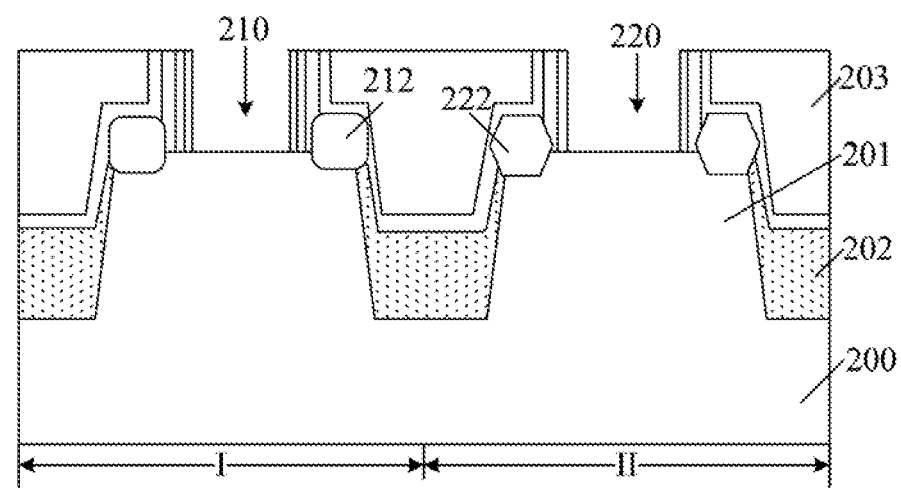

Returning to FIG. 20, further, removing each first dummy gate electrode to form a first opening and also removing each second dummy gate electrode to form a second opening (S1103). FIG. 6 shows a schematic cross-section view of a corresponding semiconductor structure.

Referring to FIG. 6, the plurality of first dummy gate electrodes 211 (referring to FIG. 5) may be removed to form a plurality of first openings 210; in the meantime, the plurality of second dummy gate electrodes 221 (referring to FIG. 5) may also be removed to form a plurality of second openings 220.

In a subsequent process, each first opening 210 may be filled up to form a first gate electrode while each second opening 220 may be filled up to form a second gate electrode.

In one embodiment, the process to remove the plurality of first gate electrodes 211 and the plurality of second gate electrodes 221 may include dry etching process or wet etching process.

Figure 7:
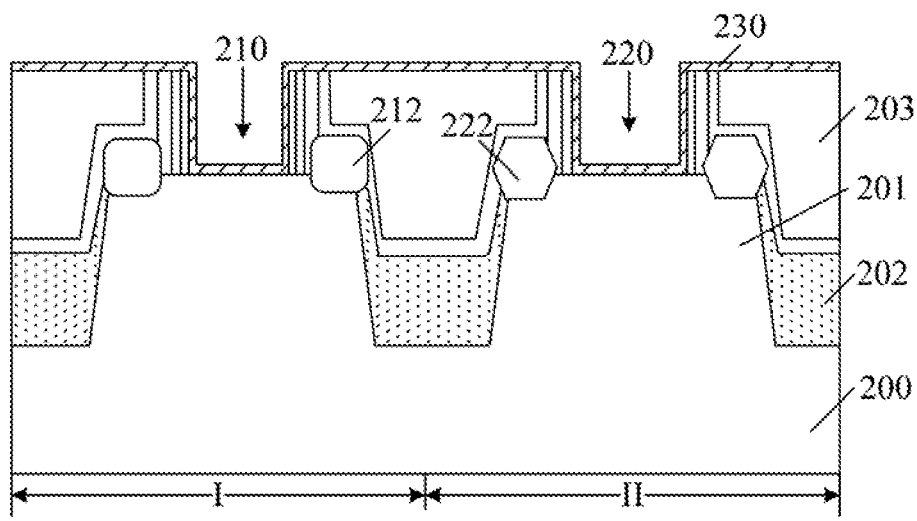

Further, returning to FIG. 20, a first work function layer may be formed on the bottom and the sidewall surfaces of the first openings, the bottom and the sidewall surfaces of the second openings, as well as the surface of the dielectric layer (S1104). FIG. 7 shows a schematic cross-section view of a corresponding semiconductor structure.

Referring to FIG. 7, a first work function layer 230 may be formed on the bottom and the sidewall surfaces of each first opening 210 and also on the bottom and the sidewall surfaces of each second opening 220. Moreover, the first work function layer 230 may also cover the surface of the dielectric layer 203.

The first work function layer may be used to adjust the work function of the transistors formed in the second transistor region II such that the threshold voltage of the formed transistor may be tuned.

In one embodiment, the second transistor region II may be used to form PMOS transistors; accordingly, the first work function layer 230 may be made of $TiO_x$ or TiON. In other embodiments, the second transistor region may be used to form NMOS transistors; accordingly, the first work function layer may be made of titanium aluminide.

The thickness of the first work function layer 230 may not be overly large or overly small. When the thickness of the first work function layer 230 is too large or too small, the threshold voltage of the formed transistor in the second transistor region II may also be overly large or overly small so that the performance of the transistor may be affected. In one embodiment, the thickness of the first work function layer 230 may be in a range of approximately 15 Å to 50 Å.

In one embodiment, the process to form the first work function layer 230 may include chemical vapor deposition (CVD) process, atomic layer deposition (ALD) process, and physical vapor deposition (PVD) process.

Moreover, prior to forming the first work function layer 230, the fabrication process may also include forming a gate dielectric layer (not shown) on the bottom and the sidewall surfaces of the first openings 210, the bottom and the sidewall surfaces of the second openings 220, and the surface of the dielectric layer 203.

In one embodiment, the gate dielectric layer may have a double-layer structure made of $SiO_x$ and high-k (i.e., k>3.9) dielectric material(s). Specifically, the high-k dielectric material may include $HfO_2$, $La_2O_3$, HfSiON, $HfAlO_2$, $ZrO_2$, Al₂O₃, HfSiO₄, etc. In other embodiments, the gate dielectric layer may also have a single-layer structure made of a high-k dielectric material.

Figure 8:
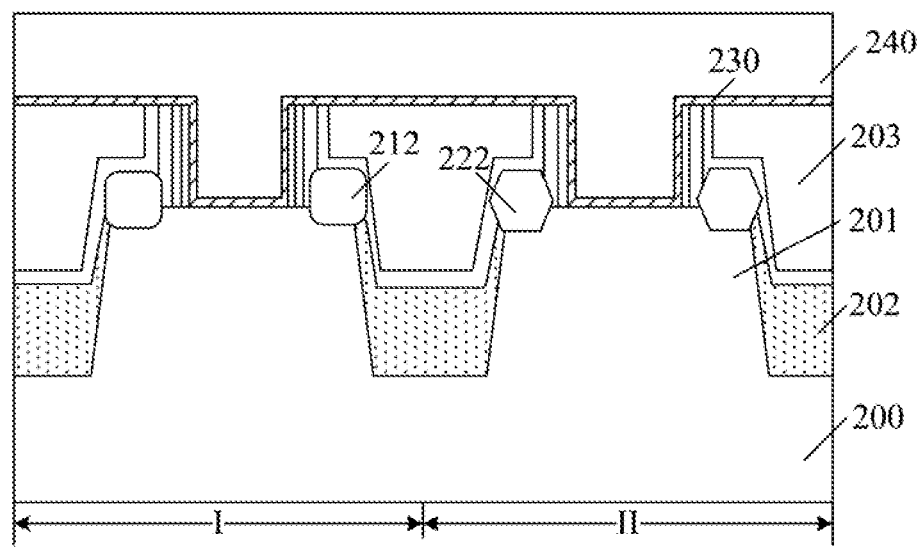

Further, returning to FIG. 20, an initial first sacrificial layer may be formed in each first opening and each second opening (S1105). FIG. 8 shows a schematic cross-section view of a corresponding semiconductor structure.

Referring to FIG. 8, after forming the first work function layer 230, an initial first sacrificial layer 240 may be subsequently-formed in the first openings 210 and the second openings 220. The initial first sacrificial layer may fill up the first openings 210 and the second openings 220, and in addition, the initial first sacrificial layer may also cover the top surface of the dielectric layer 203.

In one embodiment, the first initial sacrificial layer 240 may be an anti-reflection coating layer. Specifically, the first initial sacrificial layer 240 may be an organic anti-reflection coating layer. Further, the organic-anti-reflection coating layer may be easily dissolved in water, and thus may be removed by a water-rinsing process.

In one embodiment, the first initial sacrificial layer may be formed by a spin-coating process or by a slot-die coating process.

Figure 9:
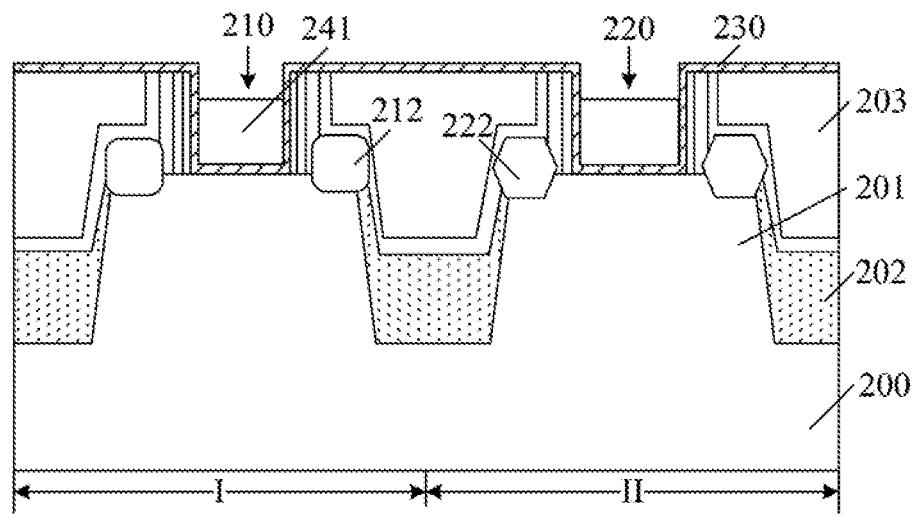

Further, returning to FIG. 20, a first sacrificial layer may be formed by removing the portion of the first initial sacrificial layer formed on the dielectric layer and also removing a portion of the first initial sacrificial layer formed in the first openings and the second openings (S1106). FIG. 9 shows a schematic cross-section view of a corresponding semiconductor structure.

Referring to FIG. 9, the portion of the first initial sacrificial layer 240 (referring to FIG. 8) formed on the dielectric layer 203, a top portion of the first initial sacrificial layer 240 formed in each first opening 210, and a top portion of the first initial sacrificial layer 240 formed in each second opening 220 may be removed to form a first sacrificial layer 241.

The first sacrificial layer may be used as an etch mask during a subsequent process to etch the first work function layer 230. The first sacrificial layer 241 may cover as portion of the first work function layer 230 formed in each second opening 220 so that may protect the portion of the first work function layer 230 in the second opening 220 from being etched. As such, the portion of the first function layer 230 in each second opening 220 may be used as the work function layer for the formed transistor in the second transistor region II, and thus the threshold voltage of the formed transistor may be adjusted.

In one embodiment, the portion of the first initial sacrificial layer 240 formed on the dielectric layer 203 as well as the top portion of the first initial sacrificial layer 240 formed in each first opening 210 and also in each second opening 220 may be removed by dry etching wet etching, or a combination of both dry etching and wet etching.

In one embodiment, the first sacrificial layer 241 may be formed from the first initial sacrificial layer 240. Therefore, the first sacrificial layer 241 and the first sacrificial layer 240 may be made of a same material. Specifically, the first sacrificial layer 241 may be made of an organic anti-reflection coating layer.

Moreover, the process to form the first sacrificial layer 241 may not need to use photoresist. As a consequence, the fabrication process for the first sacrificial layer 241 may not include forming a photoresist layer and then performing exposure and development. Therefore, the disclosed method may simplify the fabrication process.

Figure 10:
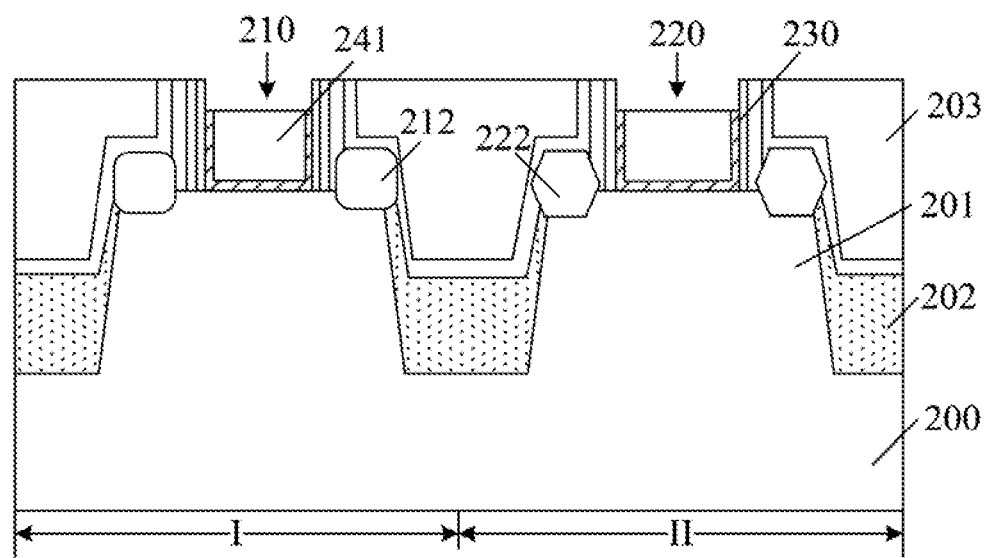

Further, returning to FIG. 20, the first work function layer may be etched by using the first sacrificial layer as an etch mask (S1107). FIG. 10 shows a schematic cross-section view of a corresponding semiconductor structure.

Referring to FIG. 10, an etching process may be performed on the first work function layer 230 by using the first sacrificial layer 241 as an etch mask.

Specifically, by etching the first work function layer 230 using the first sacrificial layer 241 as the etch mask, the portion of the first work function layer 230 formed on the dielectric layer 203, in the first openings 210, and in the second openings 220 may be removed. That is, the portion of the first work function layer 230 not covered by the first sacrificial layer 241 may be removed by etching. Therefore, the top dimension of a subsequently-formed fourth opening may also be large. Because the fourth opening may further be filled up to form a second work function layer and a second gate electrode, a large top dimension of the fourth opening may help the second work function layer and the second gate electrode fill the fourth opening.

In one embodiment, the first work function layer 230 may be etched by dry etching, wet etching, or a combination of both dry etching and wet etching.

Figure 11:
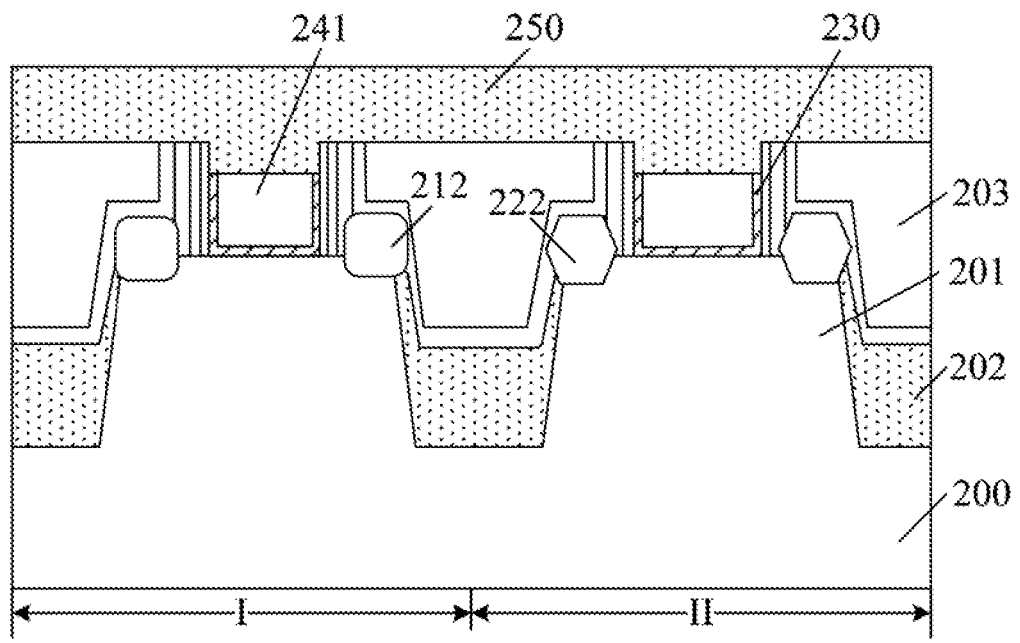

Further, returning to FIG. 20, a second initial sacrificial layer may be formed in each first opening and each second opening and also formed on the dielectric layer (S1108). FIG. 11 shows a schematic cross-section view of a corresponding semiconductor structure.

Referring to FIG. 11, a second initial sacrificial layer 250 may be formed in the first openings 210 (referring to FIG. 10), in the second openings 220 (referring to FIG. 10), and on the dielectric layer 203. The second initial sacrificial layer 250 may be used to form a second sacrificial layer in a subsequent process.

Moreover, in one embodiment, the first sacrificial layer 241 may not be removed prior to forming the second initial sacrificial layer 250. The first sacrificial layer 241 may be simultaneously removed during a subsequent process to remove the second sacrificial layer. Therefore, the fabrication process may be simplified.

In one embodiment, the second initial sacrificial layer 250 may be an anti-reflection coating layer. The anti-reflection coating layer may provide a flat surface for the photolithography process, and thus the quality of the photolithography process may be ensured.

In one embodiment, the second initial sacrificial layer 250 and the first sacrificial layer 241 may be made of a same material. Therefore, the first sacrificial layer and the subsequently-formed second sacrificial layer may be removed together by a same removal process such that the fabrication process may be simplified. Specifically, the second initial layer 250 may be an organic anti-reflection coating layer.

In one embodiment, the second initial sacrificial layer 250 may be formed by a spin-coating process or by a slot-die coating process.

Figure 12:
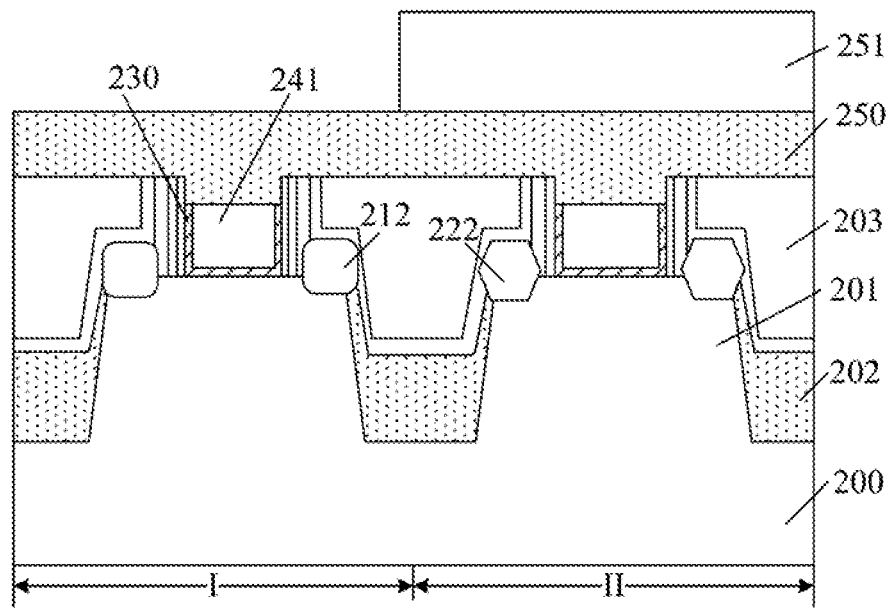

Further, returning to FIG. 20, a patterned photoresist layer may be formed on the second initial sacrificial layer and the patterned photoresist layer may expose the portion of the second initial sacrificial layer formed in the first transistor region (S1109). FIG. 12 shows a schematic cross-section view of a corresponding semiconductor structure.

Referring to FIG. 12, a patterned photoresist layer 251 may be formed on the second initial sacrificial layer 250. The patterned photoresist layer 251 may expose the portion of the second initial sacrificial layer 250 formed in the first transistor region I. The patterned photoresist layer 251 may be used as an etch mask during a subsequent etching process performed on the second initial sacrificial layer 250.

Figure 13:
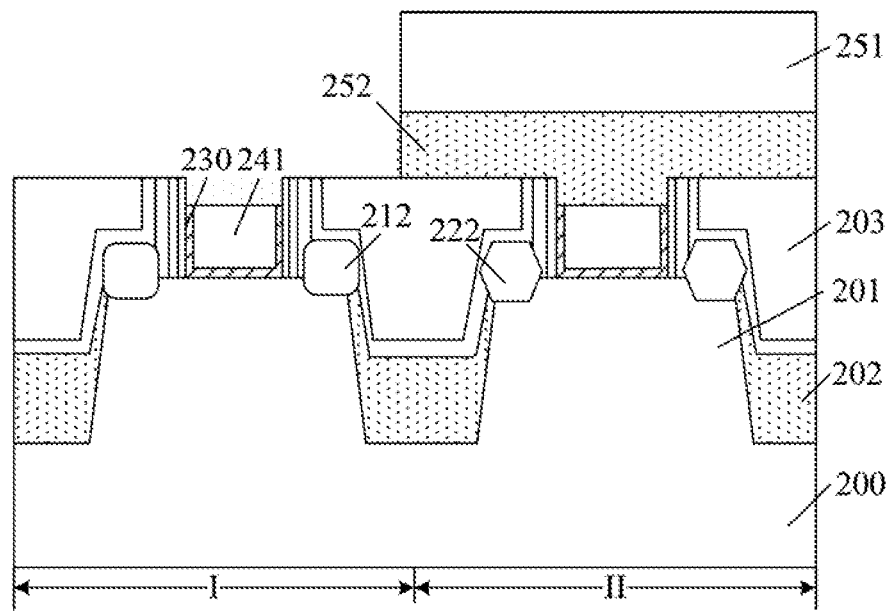

Further, a second sacrificial layer may be formed in the second transistor region II by removing the portion of the second initial sacrificial layer formed in the first transistor region through an etching process using the patterned photoresist layer as an etch mask (S1110). As such, the second sacrificial layer may then be formed in the second transistor region II. FIG. 13 shows a schematic cross-section view of a corresponding semiconductor structure.

Referring to FIG. 13, the portion of the second initial sacrificial layer 250 (referring to FIG. 12) formed in the first transistor region I may be removed by an etching process using the photoresist layer 251 as an etch mask. The second sacrificial layer 252 may be formed in the second transistor region II.

In one embodiment, the second sacrificial layer 252 and the photoresist layer 251 may be used as an etch mask during a subsequent process to etch the first work function layer 230 formed in the first opening 210. To form the second sacrificial layer 252, the second initial sacrificial layer 250 may be etched by dry etching, wet etching, or a combination of both dry etching and wet etching.

In one embodiment, the second sacrificial layer 252 may be formed from the second initial sacrificial layer 250 (referring to FIG. 12). Therefore, the second sacrificial layer 252 and the second initial sacrificial layer 250 may be made of a same material. Specifically, the second sacrificial layer 252 may be made of an organic anti-reflection coating layer.

In one embodiment, the first sacrificial layer 241 may not be removed prior to forming the second initial sacrificial layer 250. Accordingly, the portion of the first sacrificial layer 241 formed in the first transistor region I may be removed during the etching process to remove the portion of the second sacrificial layer 252 formed in the first transistor region I by using wet etching.

Figure 14:
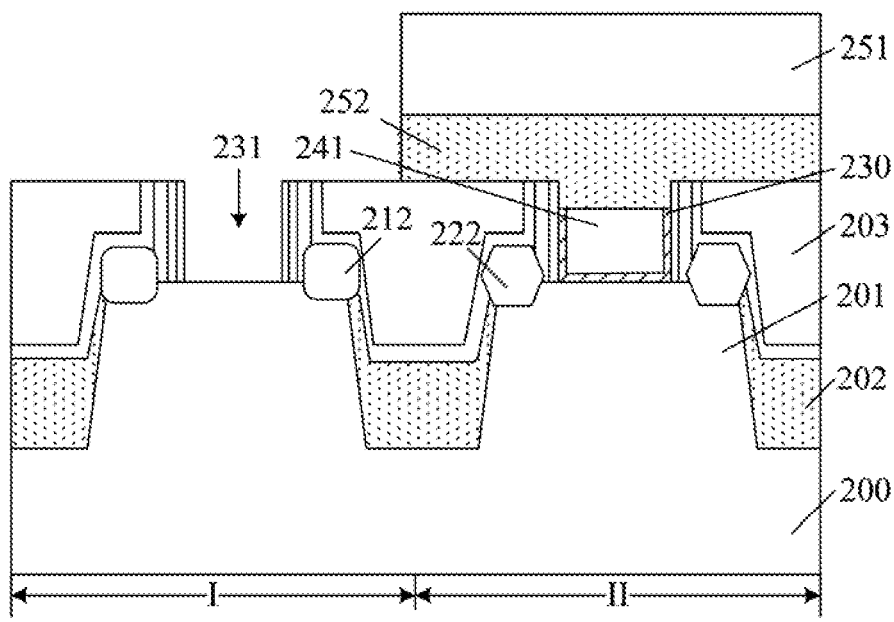

Further, returning to FIG. 20, a third opening may be formed by removing the portion of the first work function layer formed in the first transistor region through an etching process using the second sacrificial layer and the patterned photoresist layer as an etch mask (S1111). FIG. 14 shows a schematic cross-section view of a corresponding semiconductor structure.

Referring to FIG. 14, the portion of the first work function layer 230 formed in the first transistor region I may be removed by etching using the second sacrificial layer 252 and the patterned photoresist layer 251 as an etch mask. After removing the portion of the first work function layer 230 formed in the first transistor region I, a third opening 231 may be formed in the dielectric layer 203 in the first transistor region I.

In one embodiment, removing the first work function layer 230 formed in the first transistor region I may ensure that the work function layer in the first transistor region I is different from the work function layer in the second transistor region II. As such, the threshold voltages of the transistors may be adjusted by selecting the thickness of the first work function layer 230 and the thickness of the subsequently-formed second work function layer.

In one embodiment, the portion of the first work function layer 230 formed in the first transistor region I may be removed by dry etching, wet etching, or a combination of both dry etching and wet etching.

Figure 15:
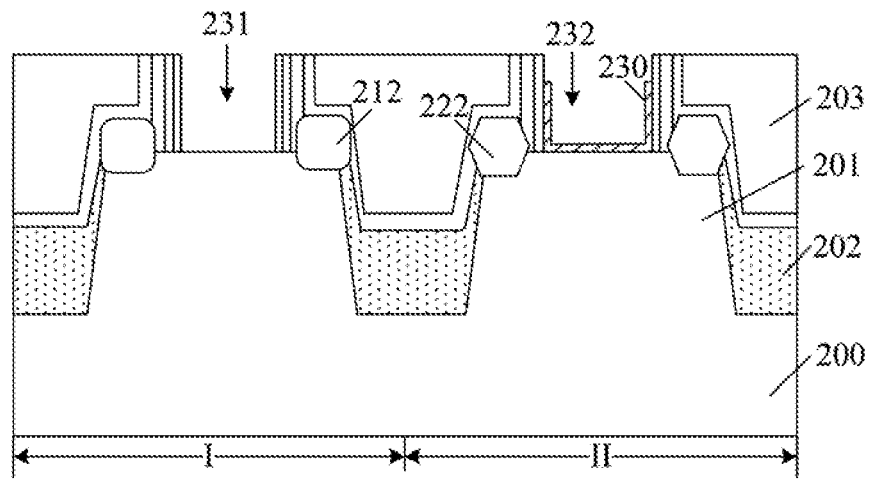

Further, returning to FIG. 20, the second sacrificial layer and the patterned photoresist layer may be removed to form a fourth opening in the dielectric layer in the second transistor region (S1112). FIG. 15 shows a schematic cross-section view of a corresponding semiconductor structure.

Referring to FIG. 15, after removing the portion of the first work function layer 230 formed in the first transistor region I, the second sacrificial layer 252 (referring to FIG. 14) and the patterned photoresist layer 251 (referring to FIG. 14) may be removed to form a fourth opening 232 in the dielectric layer 203 in the second transistor region II. The third opening 231 and the fourth opening 232 may be used to contain a subsequently-formed second work function layer as well as a subsequently-formed gate electrode.

In one embodiment, the first sacrificial layer 241 (referring to FIG. 241) and the second sacrificial layer 252 may be made of a same material. Therefore, the first sacrificial layer 241 and the second sacrificial layer may be simultaneously removed by a single process.

In one embodiment, during the process to remove the second sacrificial layer 252 (referring to FIG. 14) and the patterned photoresist layer 251, the portion of the first sacrificial layer 241 formed in the second opening 220 in the second transistor region II may also be removed.

In one embodiment, the first sacrificial layer 241 and the second sacrificial layer 252 may both be organic anti-reflection layers. Thus, the first sacrificial layer 241 and the second sacrificial layer 252 may be removed by water rinsing. In other embodiments, the first sacrificial layer, the second sacrificial layer, and the patterned layer may also be removed by a dry etching, wet etching, or ashing process.

Figure 16:
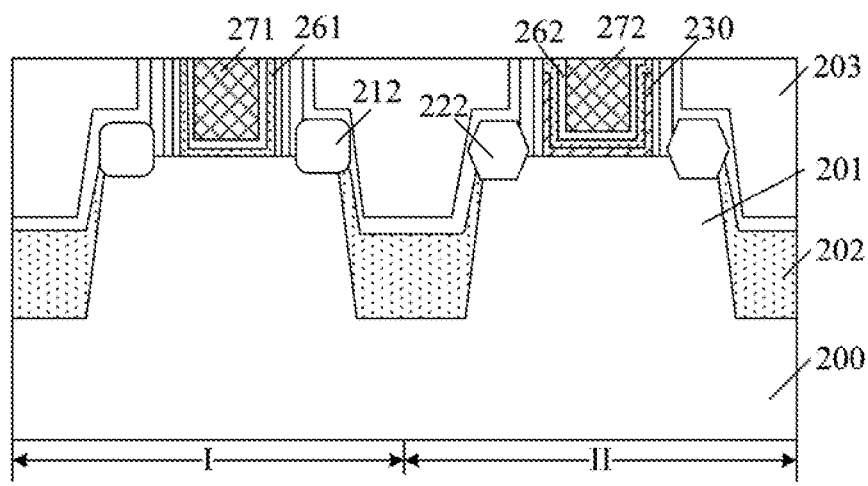

Further, returning to FIG. 20, a second work function layer and a gate electrode may be sequentially formed in the third opening and also in the fourth opening (S1113). FIG. 16 shows a schematic cross-section view of a corresponding semiconductor structure.

Referring to FIG. 16, after etching the first work function layer 230 using the first sacrificial layer 241 as an etch mask and removing the portion of the first work function layer 230 formed in the first opening 210 (referring to FIG. 10), a second work function layer 261 and a gate electrode may be sequentially formed in the third opening 231 (referring to FIG. 15) in the first transistor region I and also in the fourth opening 232 (referring to FIG. 15) in the second transistor region II. Specifically, the second work function layer 261 may be used to adjust the threshold voltage of the transistor to be formed.

In one embodiment, the first transistor region I may be used to form NMOS transistors and the second work function layer may be made of titanium aluminide. In other embodiments, the first transistor region may be used to form PMOS transistors and the second work function layer may be made of $TiN_x$ or TiON.

The thickness of the second work function layer 261 may not be too large or too small. When the thickness of the second work function layer 261 is too large or too small, the threshold voltage of the formed transistor may be overly small or overly large, and thus the performance of the transistor may be affected. Specifically, in one embodiment, the thickness of the second work function layer 261 may be in a range of approximately 10 Å to 45 Å.

In one embodiment, the gate electrode formed in the third opening 231 (referring to FIG. 15) in the first transistor region I may be a first gate electrode 271 while the gate electrode formed in the fourth opening 232 (referring to FIG. 15) in the second transistor region II may be a second gate electrode 272. In one embodiment, both of the first gate electrode 271 and the second gate electrode 272 may be metal gates. Specifically, the first gate electrode 271 and the second gate electrode 272 may be made of Al, Cu, Ag, Au, Ni, Ti, W, WN, WSi, or any other appropriate metal.

In one embodiment, prior to forming the gate electrode, the fabrication process may also include forming a covering layer 262 on the second work function layer 261.

The covering layer 262 may be used to isolate the second work function layer 261 from the gate electrode. In one embodiment, the covering layer 262 may be made of $TiN_x$.

Figure 17:
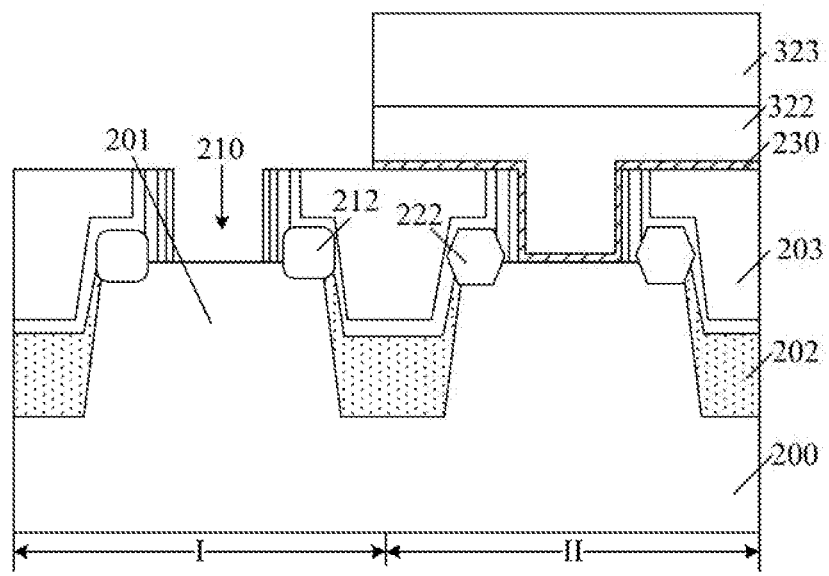
FIGS. 17-19 illustrate schematic cross-section views of semiconductor structures at certain states of another fabrication process consistent with various disclosed embodiments in the present disclosure.
Figure 18:
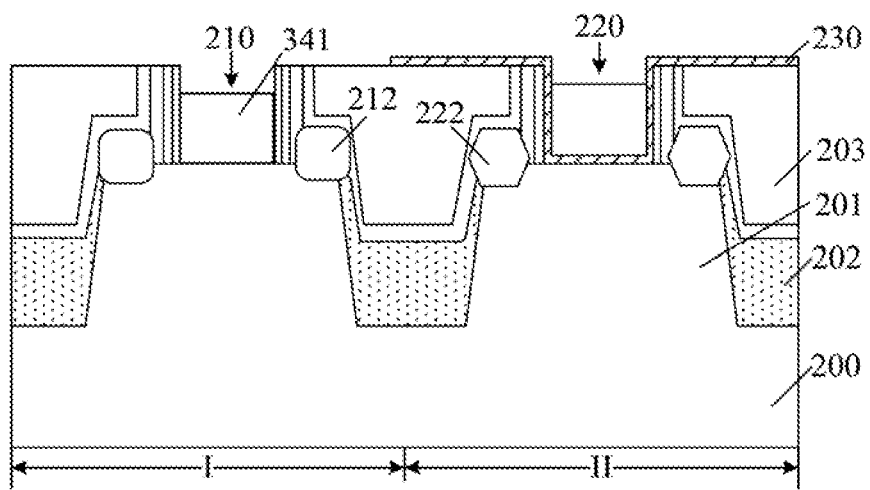
Figure 19:
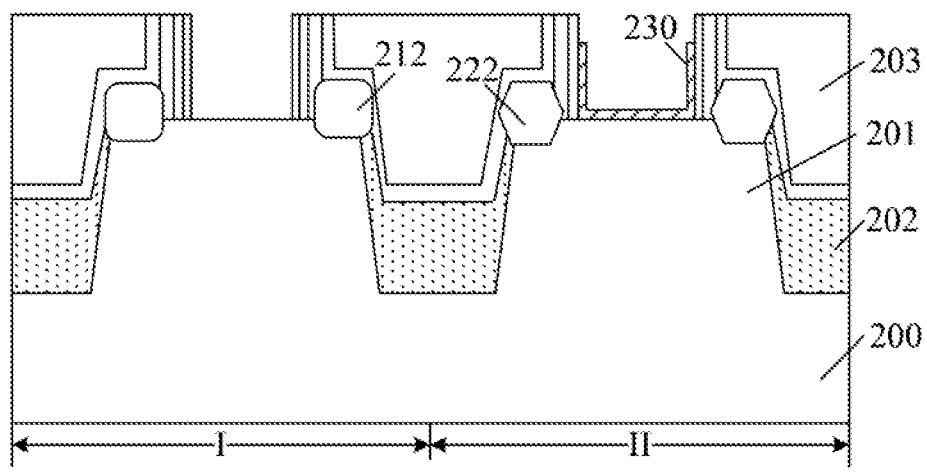

The present disclosure also provides another method for fabricating a semiconductor structure. FIGS. 17-19 show schematic cross-section views of semiconductor structures at certain stages of another fabrication process consistent with disclosed embodiments in the present disclosure. Specifically, FIG. 17 shows a semiconductor structure developed from the structure shown in FIG. 7. That is, the fabrication process may also include forming a first work function layer 230 on the bottom and sidewall surfaces of the first openings 210, the bottom and sidewall surfaces of the second openings 220, as well as the surface of the dielectric layer 203.

Further, referring to FIG. 17, after forming the first work function layer 230, the portion of the first work function layer 230 formed in each first opening 210 as well as on the dielectric layer 203 in the first transistor region I may be removed.

Specifically, in one embodiment, the process to remove the portion of the first work function layer 230 formed in the first opening 210 and on the dielectric layer 203 in the first transistor region I may include the following steps. First, a second initial sacrificial layer may be formed in the first opening 210 and the second opening 220 and also formed on the dielectric layer 203. A patterned photoresist layer 323 may then be formed on the second initial sacrificial layer. The patterned photoresist layer may be formed on the surface of the portion of the second initial sacrificial layer in the second transistor region II and may expose the surface of the portion of the second initial sacrificial layer in the first transistor region. Further, a second sacrificial layer 322 may be formed from the second initial sacrificial layer by removing the portion of the second initial layer formed in the first transistor region I using the patterned photoresist layer 323 as an etch mask. Moreover, the portion of the first work function layer 230 formed in the first transistor region I may be removed by using the second sacrificial layer 322 and the patterned photoresist layer 323 as an etch mask. Finally, the second sacrificial layer 422 and the patterned photoresist layer 323 may be removed.

Further, referring to FIG. 18, after removing the portion of the first work function layer 230 formed in each first opening 210 as well as on the dielectric layer 203 in the first transistor region I, a first sacrificial layer 341 may be formed to partially fill each first opening 210 and also partially fill each second opening 220.

Specifically, the process to form the first sacrificial layer 341 may include the following steps. First, a first initial sacrificial layer may be formed in the first opening 210 and the second opening 220 and also formed on the dielectric layer 203. Further, the first initial sacrificial layer formed on the dielectric layer 203 as well as a portion of the first initial sacrificial layer 203 formed in the first opening 210 and the second opening 220 may be removed to form the first sacrificial layer 341.

Further, referring to FIG. 19, an etching process using the first sacrificial layer 341 (referring to FIG. 18) as an etch mask may be performed. Specifically, during the etching process, the first work function layer 230 formed on the dielectric layer 203 in the second transistor region II as well as a portion of the first work function layer 230 formed on the sidewall surfaces of the second opening 220 may be removed.

Further, the first sacrificial layer 341 (referring to FIG. 18) may also be removed to form a third opening (not labeled) on each fin structure 201 in the first transistor region I and a fourth opening (not labeled) on each fin structure in the second transistor region II. In one embodiment, the first sacrificial layer 341 may be removed by a water-rinsing process because the operation of the water-rinsing process may be simple. In another embodiment, the first sacrificial layer may also be removed by a dry etching or wet etching process.

The fabrication process may further include forming a second work function layer on the sidewall and the bottom surfaces of each third opening and each fourth opening. Specifically, in each fourth opening, the second work function layer may cover the remaining portion of the first work function layer 230 as well as the exposed portion of the sidewall surfaces of the fourth opening.

Further, the fabrication process may also include forming a gate electrode to fill each third opening and each fourth opening. In one embodiment, the gate electrode may be made of a metal including Al, Cu, Ag, Au, Ni, Ti, W, WN, WSi, etc.

The present disclosure also provides a semiconductor structure. FIG. 16 shows a schematic cross section view of the semiconductor structure.

Referring to FIG. 16, the semiconductor structure may include a base structure. The base structure may include a substrate 200 and a plurality of fin structures 201 formed on the substrate 200. The semiconductor structure may include a first transistor region I and a second transistor region II. The plurality of fin structures 201 may be formed in both the first transistor region I and the second transistor region II. For illustration purpose, the semiconductor structure is described to have a fin structure 201 formed in the first transistor region I and a fin structure 201 formed in the second transistor region.

Further, the semiconductor structure may include an isolation layer 202 formed on the substrate and covering the sidewall surfaces of the fin structures 201 and a dielectric layer 203 formed on the isolation layer 202.

Moreover, the semiconductor structure may include a plurality of gate structures (not labeled) formed on the fin structures 201. Specifically, the gate structure formed on each fin structure 201 in the first transistor region I may be a first gate structure and the gate structure formed on each fin structure 201 in the second transistor region II may be a second gate structure. Each first gate structure may further include a gate dielectric layer (not shown) formed on the top surface of the corresponding fin structure 201, a second work function layer 261 formed on the gate dielectric layer and covering the sidewall surface of the dielectric layer 203, and a first gate electrode 271 formed on the second work function layer 261; while each second gate structure may further include a gate dielectric layer (not shown) formed on the corresponding fin structure 201, a first work function layer 230 formed on the gate dielectric layer and covering a bottom portion of the sidewall surfaces of the dielectric layer 203, a second work function layer 261 formed on the first work function layer 230 and covering the top portion of the sidewall surfaces of the dielectric layer 203 above the first work function layer 230, and a second gate electrode 272 formed on the second work function layer 261. The top surfaces of the plurality of gate structures may be leveled with the top surface of the dielectric layer 203.

During the fabrication of the semiconductor structure, the first work function layer may be formed in both the first transistor region I and the second transistor region II. Specifically, prior to forming the gate structures, a first opening may be formed on each first fin structure and a second opening may be formed on each second fin structure by removing a corresponding dummy gate structure. The first work function layer may then be formed on the bottom and the sidewall surfaces of each first opening as well as the bottom and the sidewall surfaces of each first opening. After forming the first work function layer, a first sacrificial layer may be formed to partially fill up each first opening and each second opening. Further, by using the first sacrificial layer as an etch mask, the exposed portion of the first work function layer in each first opening and each second opening may be removed. In addition, after removing the first sacrificial layer, the first work function layer formed in each first opening may be completely removed before forming the second work function layer.

Moreover, the semiconductor structure may also include a covering layer 262 formed between the second work function layer 261 and the first gate electrode 271 in each first gate structure and between the second work function layer 261 and the second gate electrode 272 in each second gate structure.

Further, the semiconductor structure may also include a first source/drain region 212 formed in each fin structure in the first transistor region I on each side of the first fin structure and a second source/drain region 212 formed in each fin structure in the second transistor region II on each side of the second fin structure.

Compared to existing fabrication methods and semiconductor structures, the disclosed fabrication methods and semiconductor structures may demonstrate several advantages.

According to the disclosed fabrication methods, after forming the first work function layer, a first sacrificial layer may be formed to partially fill the first opening and the second opening. Then, by using the first sacrificial layer as an etch mask, a portion of the first work function layer formed in the second opening may be removed. The process to remove the portion of the first work function layer formed in the second opening may not need to use photoresist. As a consequence, the fabrication process for the first sacrificial layer may not include forming a photoresist layer and then performing exposure and development. Therefore, the disclosed method may simplify the fabrication process.

Further, after etching the first work function layer using the first sacrificial layer as the etch mask, the first work function layer formed in the first opening may be completely removed. During the process to remove the first work function layer formed in the first opening, a second initial sacrificial layer may be directly formed on the first sacrificial layer. Further, during the process to form the second sacrificial layer by patterning the second initial sacrificial layer, the first sacrificial layer formed in the first opening may be simultaneously removed with the portion of the second initial sacrificial layer formed in the first transistor region. Therefore, the step to remove the first sacrificial layer prior to forming the second initial sacrificial layer may be saved such that the fabrication process may be further simplified.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
   providing a base structure having a first transistor region and a second transistor region, wherein the base structure includes a substrate, a dielectric layer formed on the substrate, a plurality of first openings formed in the dielectric layer in the first transistor region, and a plurality of second openings formed in the dielectric layer in the second transistor region;
   forming a first work function layer on the dielectric layer and covering bottom and sidewall surfaces of each of the plurality of the first opening and of each of the plurality of the second opening;
   forming a first sacrificial layer in each first opening and each second opening, wherein a top surface of the first sacrificial layer is lower than a top surface of the dielectric layer;
   removing a portion of the first work function layer exposed by the first sacrificial layer in each first opening and each second opening using the first sacrificial layer as a first etch mask;
   forming a second sacrificial layer in the second transistor region;
   removing the first sacrificial layer from each first opening after removing the portion of the first work function layer formed in each first opening and a remaining portion of the first work function layer formed in each first opening by etching using the second sacrificial layer as a second etch mask;
   removing the second sacrificial layer in the second transistor region;
   removing the first sacrificial layer from each second opening after removing the remaining portion of the first work function layer formed in each first opening, wherein the second sacrificial layer and the first sacrificial layer are removed by a same etching process after removing the portion of the first work function layer formed in the first transistor region; and
   forming a second work function layer and then a gate electrode in each first opening and each second opening.

2. The method for fabricating the semiconductor structure according to claim 1, wherein removing the first sacrificial layer from each first opening and removing the first sacrificial layer from each second opening include ashing, dry etching, or wet etching.

3. The method for fabricating the semiconductor structure according to claim 1,
   wherein forming the first sacrificial layer includes:
   forming a first initial sacrificial layer on the first work function layer; and
   forming the first sacrificial layer by removing a portion of the first initial sacrificial layer formed in each first opening and each second opening as well as the first initial sacrificial layer formed on the dielectric layer.

4. The method for fabricating the semiconductor structure according to claim 3, wherein forming the first initial sacrificial layer includes a spin-coating or slot-die coating process.

5. The method for fabricating the semiconductor structure according to claim 3, wherein removing the portion of the first initial sacrificial layer formed in each first opening and each second opening as well as the first initial sacrificial layer formed on the dielectric layer includes one or more of a wet etching process and a dry etching process.

6. The method for fabricating the semiconductor structure according to claim 1, wherein removing the remaining portion of the first work function layer formed in each first opening includes:
- forming a second initial sacrificial layer on the dielectric layer and directly on the first sacrificial layer in each first opening and each second opening;
- forming a patterned photoresist layer on the second initial sacrificial layer, wherein the patterned photoresist layer exposes a portion of the second initial sacrificial layer formed in the first transistor region;
- forming the second sacrificial layer in the second transistor region by removing the portion of the second initial sacrificial layer formed in the first transistor region using the patterned photoresist layer as an etch mask; and
- removing the patterned photoresist layer after removing the portion of the first work function layer formed in the first transistor region.

7. The method for fabricating the semiconductor structure according to claim 6, wherein the first sacrificial layer and the second sacrificial layer are made of a same material.

8. The method for fabricating the semiconductor structure according to claim 1, wherein the first sacrificial layer is an organic anti-reflection coating layer.

9. The method for fabricating the semiconductor structure according to claim 1, further including:
- forming N-type metal-oxide-semiconductor (NMOS) transistors in the first transistor region;
- forming P-type metal-oxide-semiconductor (PMOS) transistors in the second transistor region;
- the first work function layer is made of $TiN_x$ or TiON; and
- the second work function layer is made of titanium aluminide.

10. The method for fabricating the semiconductor structure according to claim 1, further including:
- forming PMOS transistors in the first transistor region;
- forming NMOS transistors in the second transistor region;
- the first work function layer is made of titanium aluminide; and
- the second work function layer is made of $TiN_x$ or TiON.

11. The method for fabricating the semiconductor structure according to claim 1, further including:
- a covering layer, sandwiched by the second work function layer and the gate electrode, on the second work function layer, wherein the second work function layer is formed on the substrate in the first opening and the second work function layer is formed directly on and completely covers the first work function layer in the second opening.

12. The method for fabricating the semiconductor structure according to claim 1, wherein after removing the portion of the first work function layer exposed by the first sacrificial layer in each first opening and each second opening using the first sacrificial layer:
- the top surface of the dielectric layer is completely exposed, and the sidewall surfaces of each of the plurality of the first opening and of each of the plurality of the second opening are partially exposed.

* * * * *